United States Patent
Yamada et al.

(10) Patent No.: US 9,624,603 B2
(45) Date of Patent: Apr. 18, 2017

(54) VAPOR PHASE GROWTH APPARATUS HAVING SHOWER PLATE WITH MULTI GAS FLOW PASSAGES AND VAPOR PHASE GROWTH METHOD USING THE SAME

(71) Applicant: Nuflare Technology, Inc., Yokohama (JP)

(72) Inventors: Takumi Yamada, Kanagawa (JP); Yuusuke Sato, Tokyo (JP)

(73) Assignee: NuFlare Technology, Inc., Yokohama (JP)

( * ) Notice: Subject to any disclaimer, the term of this patent is extended or adjusted under 35 U.S.C. 154(b) by 500 days.

(21) Appl. No.: 14/164,498

(22) Filed: Jan. 27, 2014

(65) Prior Publication Data

US 2014/0209015 A1    Jul. 31, 2014

(30) Foreign Application Priority Data

Jan. 30, 2013    (JP) .................................. 2013-016015

(51) Int. Cl.
  *C30B 25/14*    (2006.01)
  *C30B 25/12*    (2006.01)
  (Continued)

(52) U.S. Cl.
  CPC ............. *C30B 25/14* (2013.01); *C23C 16/303* (2013.01); *C23C 16/45565* (2013.01); *C23C 16/45574* (2013.01); *C30B 25/12* (2013.01)

(58) Field of Classification Search
  CPC ......... C30B 25/00; C30B 25/02; C30B 25/14; C30B 25/16; C30B 29/00; C30B 29/10;
  (Continued)

(56) References Cited

U.S. PATENT DOCUMENTS

2005/0092248 A1    5/2005    Lee et al.
2006/0021574 A1*   2/2006    Armour ............ C23C 16/45565
                                                      118/715
2013/0152853 A1    6/2013    Suzuki et al.

FOREIGN PATENT DOCUMENTS

CN         1611637 A        5/2005
JP         2001-81569       3/2001
(Continued)

OTHER PUBLICATIONS

Office Action issued Dec. 19, 2014 in Korean Patent Application No. 10-2014-0010238 (with English language translation).
(Continued)

*Primary Examiner* — Kenneth A Bratland, Jr.
(74) *Attorney, Agent, or Firm* — Oblon, McClelland, Maier & Neustadt, L.L.P.

(57) ABSTRACT

A vapor phase growth apparatus in an embodiment includes: a shower plate in an upper portion of the reaction chamber, the shower plate having first lateral gas flow passages in a first horizontal plane, first longitudinal gas flow passages being connected to the first lateral gas flow passages, the first longitudinal gas flow passages extending in a longitudinal direction, each of the first longitudinal gas flow passages having a first gas ejection hole, the shower plate having second lateral gas flow passages in a second horizontal plane upper than the first horizontal plane, second longitudinal gas flow passages being connected to the second lateral gas flow passages, the second longitudinal gas flow passages extending in the longitudinal direction through between the first lateral gas flow passages, each of the second longitudinal gas flow passages having a second gas ejection hole, and a support unit provided below the shower plate.

11 Claims, 6 Drawing Sheets

(51) Int. Cl.
*C23C 16/30* (2006.01)
*C23C 16/455* (2006.01)

(58) Field of Classification Search
CPC ....... C30B 29/38; C23C 16/30; C23C 16/301; C23C 16/303; C23C 16/455; C23C 16/45563; C23C 16/45565; C23C 16/45574
USPC ... 117/84, 88–89, 93, 98–99, 102, 200, 204, 117/937, 952
See application file for complete search history.

(56) References Cited

FOREIGN PATENT DOCUMENTS

| | | |
|---|---|---|
| JP | 3572211 | 9/2004 |
| JP | 2008-508744 | 3/2008 |
| JP | 2008-297597 A | 12/2008 |
| JP | 2009-105165 A | 5/2009 |
| JP | 2010-238831 | 10/2010 |
| JP | 2011-109141 A | 6/2011 |
| JP | 2012-39152 A | 2/2012 |
| JP | 2013-145873 | 7/2013 |
| KR | 10-2009-0011978 | * 2/2009 |
| KR | 10-2009-0011978 A | 2/2009 |
| KR | 10-2011-0074854 | 7/2011 |

OTHER PUBLICATIONS

Office Action issued Jul. 20, 2015 in Korean Patent Application No. 10-2014-0010238 (with English language translation).
Combined Chinese Office Action and Search Report issued Nov. 25, 2015 in Patent Application No. 201410041218.1 (with English language translation).
Office Action issued Sep. 27, 2016 in Japanese Patent Application No. 2013-016015 (with English language translation).

* cited by examiner

FIG.2
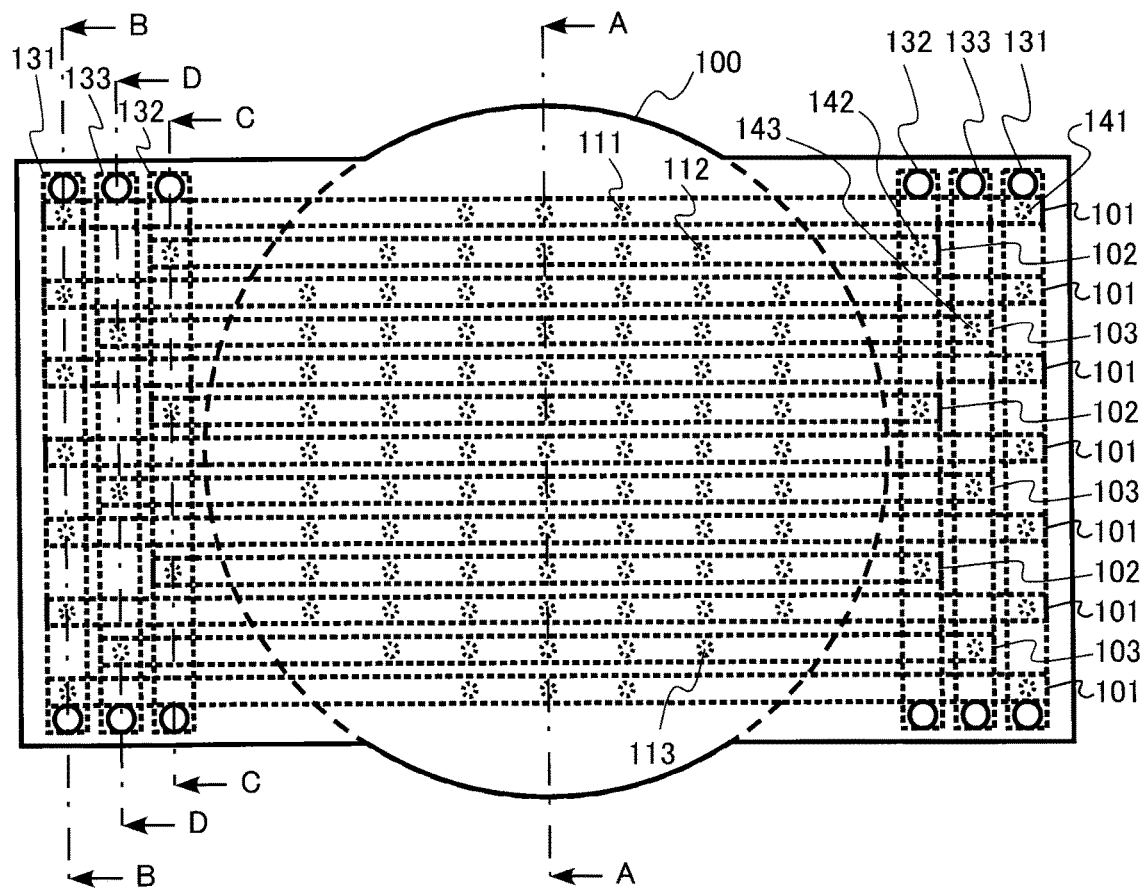
FIG.3  AA Cross-Section
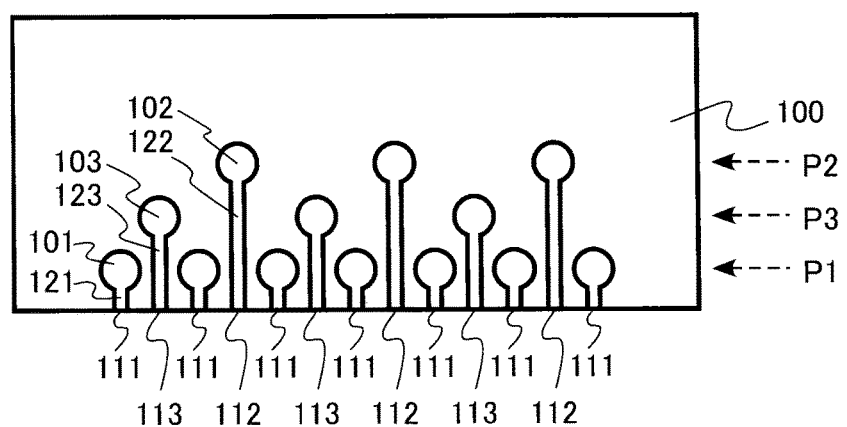

FIG.4A BB Cross-Section
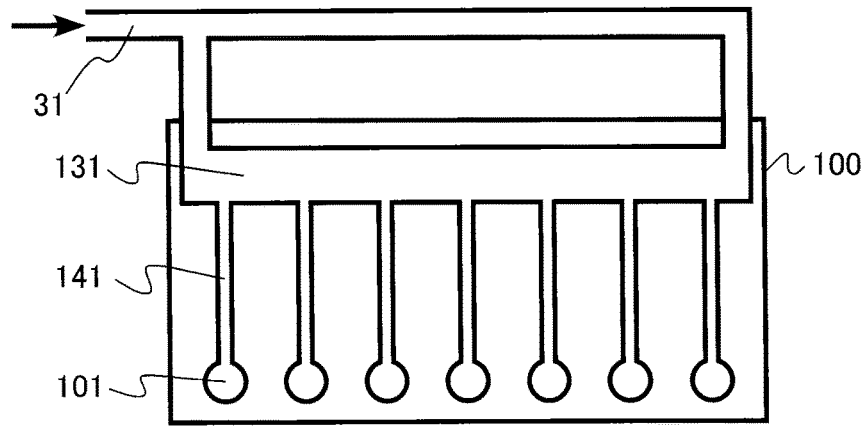
FIG.4B CC Cross-Section
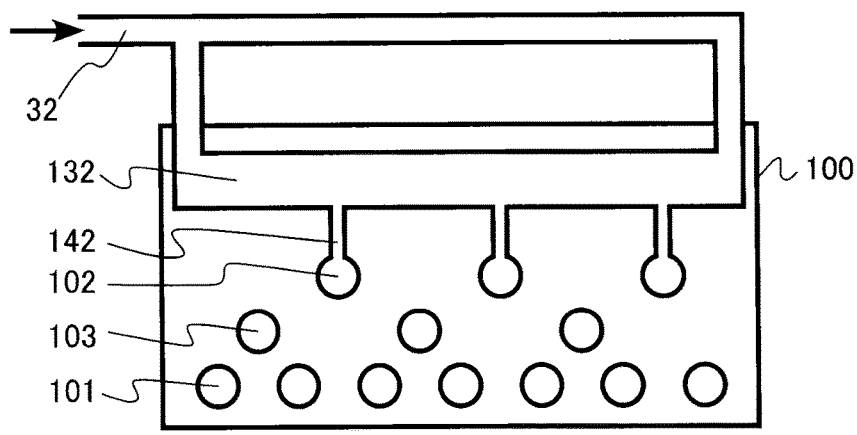
FIG.4C DD Cross-Section
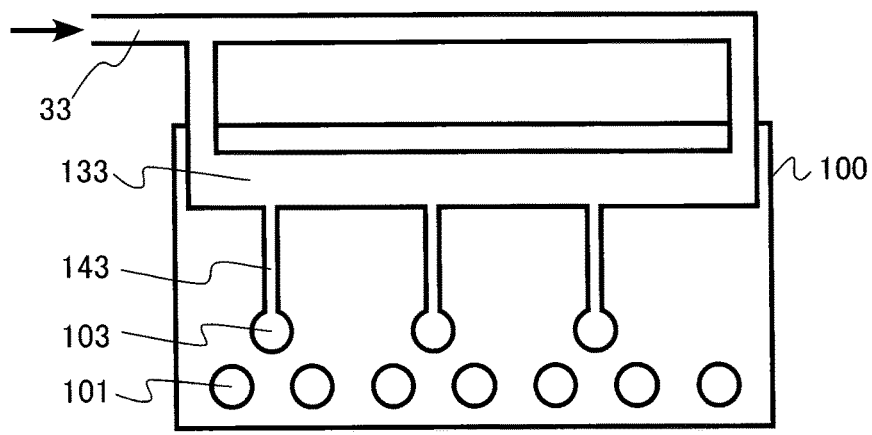

EE Cross-Section

FIG.7
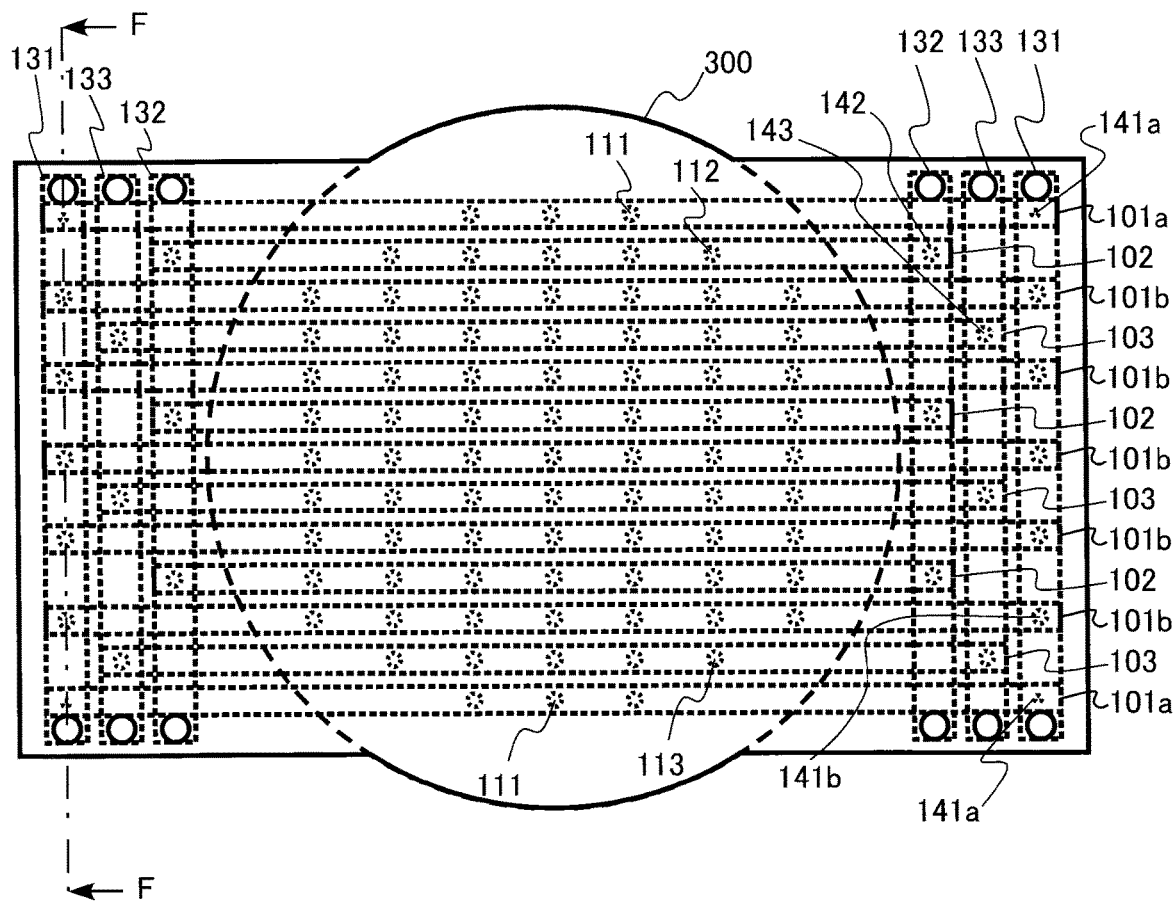
FIG.8  FF Cross-Section
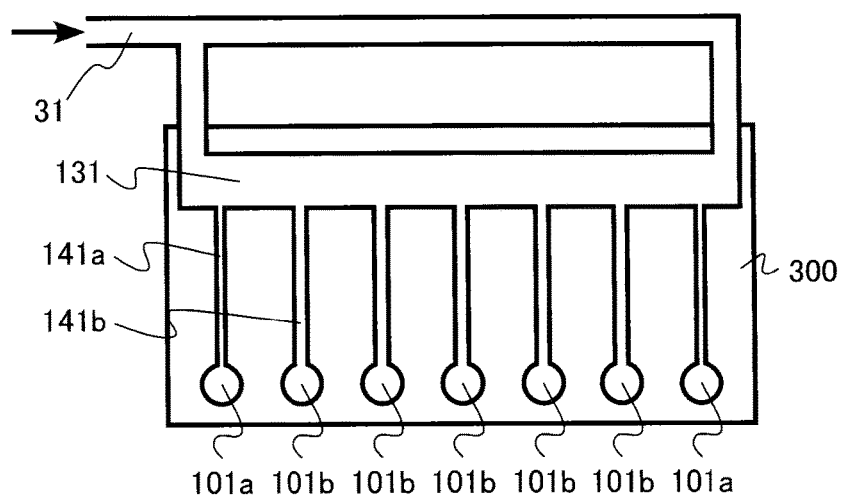

Position of Gas Ejection Hole

VAPOR PHASE GROWTH APPARATUS HAVING SHOWER PLATE WITH MULTI GAS FLOW PASSAGES AND VAPOR PHASE GROWTH METHOD USING THE SAME

CROSS-REFERENCE TO RELATED APPLICATION

This application is based upon and claims the benefit of priority from Japanese Patent Applications No. 2013-016015, filed on Jan. 30, 2013, the entire contents of which are incorporated herein by reference.

FIELD OF THE INVENTION

Embodiments described herein relate generally to a vapor phase growth apparatus and a vapor phase growth method of supplying a gas to perform film-formation.

BACKGROUND OF THE INVENTION

As a method of forming a high-quality thick semiconductor film, there is an epitaxial growth technique for growing a single crystal film on a substrate such as a wafer by vapor phase growth. In a vapor phase growth apparatus using the epitaxial growth technique, a wafer is placed on a support unit in a reaction chamber held at a normal pressure or a reduced pressure. While the wafer is heated, a process gas such as a source gas which is a raw material used in the film-formation is supplied from, for example, a shower plate disposed in an upper portion of the reaction chamber to a surface of the wafer. A thermal reaction of the source gas occurs on the wafer surface, and an epitaxial single crystal film is formed on the wafer surface. Recently, as a material of a light emitting device and a power device, a GaN (gallium nitride)-based semiconductor device has been attracted attention. As an example of an epitaxial growth technique for film-forming a GaN-based semiconductor, an organic metal vapor phase growth method (MOCVD method) is used. In the organic metal vapor phase growth method, organic metal such as trimethylgallium (TMG), trimethylindium (TMI) and trimethylaluminum (TMA), ammonia ($NH_3$), or the like is used as the source gas. Hydrogen ($H_2$) or the like may be used as a separation gas for suppressing a reaction between the source gases.

In the epitaxial growth technique and particularly in the MOCVD method, in order to form a uniform film on a wafer surface, it is important to suitably mix the source gas, the separation gas, and so on to supply the mixed gas in a uniform rectified state to the wafer surface. JP-A 2001-81569 describes a method in which in order to suitably mix different gases, source gases are separated into different gas diffusion chambers until the source gases are introduced into a reaction chamber.

SUMMARY OF THE INVENTION

A vapor phase growth apparatus in one aspect of the present disclosure includes: a reaction chamber; a shower plate disposed in an upper portion of the reaction chamber, the shower plate having first lateral gas flow passages arranged in a first horizontal plane and extending parallel to each other, first longitudinal gas flow passages being connected to the first lateral gas flow passages, the first longitudinal gas flow passages extending in a longitudinal direction, each of the first longitudinal gas flow passages having a first gas ejection hole provided on the reaction chamber side, the shower plate having second lateral gas flow passages arranged in a second horizontal plane upper than the first horizontal plane and extending parallel to each other in the same direction as the first lateral gas flow passages, second longitudinal gas flow passages being connected to the second lateral gas flow passages, the second longitudinal gas flow passages extending in the longitudinal direction through between the first lateral gas flow passages, each of the second longitudinal gas flow passages having a second gas ejection hole provided on the reaction chamber side, the shower plate configured to supply gas into the reaction chamber; and a support unit provided below the shower plate in the reaction chamber, the support unit being capable of placing a substrate thereon.

A vapor phase growth method according to one aspect of the present disclosure uses a vapor phase growth apparatus including a reaction chamber, a shower plate disposed in an upper portion of the reaction chamber, the shower plate having first lateral gas flow passages arranged in a first horizontal plane and extending parallel to each other, first longitudinal gas flow passages being connected to the first lateral gas flow passages, the first longitudinal gas flow passages extending in a longitudinal direction, each of the first longitudinal gas flow passages having a first gas ejection hole provided on the reaction chamber side, the shower plate having second lateral gas flow passages arranged in a second horizontal plane upper than the first horizontal plane and extending parallel to each other in the same direction as the first lateral gas flow passages, second longitudinal gas flow passages being connected to the second lateral gas flow passages, the second longitudinal gas flow passages extending in the longitudinal direction through between the first lateral gas flow passages, each of the second longitudinal gas flow passages having a second gas ejection hole provided on the reaction chamber side, the shower plate configured to supply gas into the reaction chamber, and a support unit provided below the shower plate in the reaction chamber, the support unit being capable of placing a substrate thereon, the method comprising: placing a substrate on the support unit; heating the substrate; ejecting a process gas through the first and second gas ejection holes; and forming a semiconductor film on a surface of the substrate.

BRIEF DESCRIPTION OF THE DRAWINGS

FIG. 2 is a schematic top view of a shower plate of the first embodiment;

FIG. 3 is an A-A cross-sectional view of the shower plate of FIG. 2;

FIGS. 4A, 4B, and 4C are respectively B-B, C-C, and D-D cross-sectional views of the shower plate of FIG. 2;

FIG. 7 is a schematic top view of a shower plate of a third embodiment;

FIG. 8 is an F-F cross-sectional view of the shower plate of FIG. 7; and

DETAIL DESCRIPTION OF THE EMBODIMENTS

Figure 1:
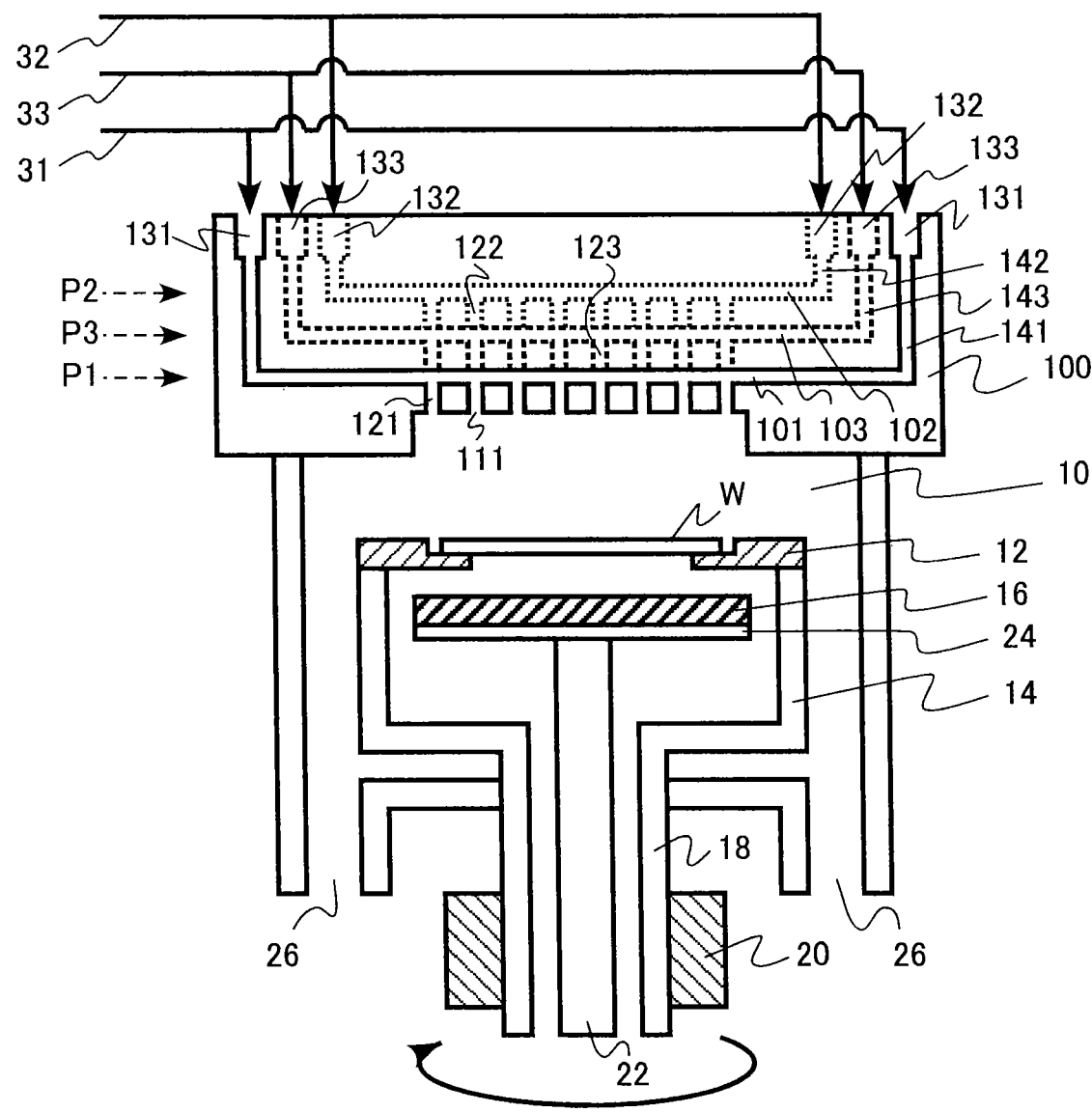
FIG. 1 is a schematic cross-sectional view of a vapor phase growth apparatus of a first embodiment.

Hereinafter, embodiments of the present disclosure will be described with reference to drawings.

In this specification, in such a state that a vapor phase growth apparatus is installed so that film formation can be performed, a gravitational force direction is defined as "below" or "lower", and the opposite direction is defined as "above" or "upper". Accordingly, a "lower portion" means a position in the gravitational force direction with respect to a reference, and "below" or "lower" means the gravitational force direction with respect to the reference. An "upper portion" means a position in a direction opposite to the gravitational force direction with respect to the reference, and "above" or "upper" means the opposite direction to the gravitational force direction with respect to the reference. A "longitudinal direction" is the gravitational force direction.

In this specification, a "horizontal plane" means a plane vertical to the gravitational force direction.

In this specification, a "process gas" is a general term of gases used for film formation on a substrate and a concept including a source gas, a carrier gas, and a separation gas, for example.

First Embodiment

A vapor phase growth apparatus of this embodiment includes a reaction chamber, a shower plate disposed in an upper portion of the reaction chamber and configured to supply a gas into the reaction chamber, and a support unit provided below the shower plate in the reaction chamber and capable of placing a substrate thereon. The shower plate includes first lateral gas flow passages arranged in a first horizontal plane and extending parallel to each other, first longitudinal gas flow passages being connected to the first lateral gas flow passages, the first longitudinal gas flow passages extending in a longitudinal direction, each of the first longitudinal gas flow passages having a first gas ejection hole provided on the reaction chamber side. And the shower plate includes second lateral gas flow passages arranged in a second horizontal plane upper than the first horizontal plane and extending parallel to each other in the same direction as the first lateral gas flow passages, second longitudinal gas flow passages being connected to the second lateral gas flow passages, the second longitudinal gas flow passages extending in the longitudinal direction through between the first lateral gas flow passages, each of the second longitudinal gas flow passages having a second gas ejection hole provided on the reaction chamber side.

The vapor phase growth apparatus of this embodiment has the above constitution, whereby an interval of the gas ejection holes ejecting a process gas into the reaction chamber is reduced, and the arrangement density of the gas ejection holes can be increased. At the same time, fluid resistance of the gas flow passage through which the process gas reaches the gas ejection hole is reduced, whereby the flow rate distribution of a gas ejected from the gas ejection hole can be uniformized. Accordingly, according to the vapor phase growth apparatus of this embodiment, a film excellent in uniformity of film thickness, film quality, and so on can be grown on the substrate.

Hereinafter, an example in which GaN (gallium nitride) is epitaxially grown by using an MOCVD method (organic metal vapor phase growth method) will be described.

FIG. 1 is a schematic cross-sectional view of a vapor phase growth apparatus of this embodiment. The vapor phase growth apparatus of this embodiment is a single wafer type epitaxial growth apparatus.

As shown in FIG. 1, the epitaxial growth apparatus of this embodiment has a reaction chamber 10 which is formed of, for example, stainless steel and is a hollow cylindrical body.

The epitaxial growth apparatus further includes a shower plate (or an injector head) 100 disposed in an upper portion of the reaction chamber 10 and configured to supply a process gas into the reaction chamber 10.

The epitaxial growth apparatus further includes a support unit 12 provided below the shower plate 100 in the reaction chamber 10 and capable of placing a semiconductor wafer (substrate) W thereon. The support unit 12 is, for example, an annular holder having an opening at its center or a susceptor configured to be in contact with the substantially entire rear surface of the semiconductor wafer W.

The epitaxial growth apparatus furthermore includes a rotating rotary body unit 14 in which the support unit 12 is disposed on the upper surface and a heater which is a heating unit 16 heating the wafer W placed on the support unit 12 by radiation heat and is provided below the support unit 12. In the rotary body unit 14, a rotation shaft 18 is connected to a rotation driving mechanism 20 located below. The semiconductor wafer W can be rotated around the center at a high rotation speed of 300 rpm to 1000 rpm by the rotation driving mechanism 20.

The cylindrical rotary body unit 14 preferably has a diameter substantially the same as an outer peripheral diameter of the support unit 12. The cylindrical rotation shaft 18 is connected to a vacuum pump (not shown) used for evacuating the inside of the hollow rotary body unit 14. A constitution may be adopted in which the semiconductor wafer W is vacuum-sucked onto the support unit 12 by suction of the vacuum pump. The rotation shaft 18 is rotatably provided in a bottom portion of the reaction chamber 10 through a vacuum seal member.

The heating unit 16 is provided to be fixed onto a support base 24 fixed to a support shaft 22 penetrating through the inside of the rotation shaft 18. The support base 24 has, for example, a push-up pin (not shown) used for mounting and dismounting the semiconductor wafer W to and from the support unit 12.

The reaction chamber 10 has in its bottom portion a gas exhaust unit 26 exhausting, to the outside of the reaction chamber 10, a reaction product produced after reaction of the source gas on a surface of the semiconductor wafer W and so on and a residual gas in the reaction chamber 10. The gas exhaust unit 26 is connected to the vacuum pump (not shown).

The epitaxial growth apparatus of this embodiment has a first gas supply passage 31 through which a first process gas is supplied, a second gas supply passage 32 through which a second process gas is supplied, and a third gas supply passage 33 through which a third process gas is supplied.

For example, when a GaN single crystal film is formed on the semiconductor wafer W by the MOCVD method, for example, hydrogen ($H_2$) as a separation gas is supplied as the first process gas, ammonia ($NH_3$) as a source gas of nitrogen (N) is supplied as the second process gas, and a gas prepared by diluting organic metal trimethylgallium (TMG) as a Ga (gallium) source gas with hydrogen ($H_2$) as a carrier gas is supplied as the third process gas.

When the separation gas as the first process gas is ejected from a first gas ejection hole 111, the separation gas separates the second process gas (herein ammonia) ejected from a second gas ejection hole 112 and the third process gas (herein TMG) ejected from a third gas ejection hole 113. A gas having little reactivity to the second process gas and the third process gas is preferably used as the separation gas.

In the single wafer type epitaxial growth apparatus show in FIG. 1, a wafer outlet and inlet (not shown) for taking the semiconductor wafer in and out and a gate valve are provided at a side wall portion of the reaction chamber 10. According to this constitution, the semiconductor wafer W can be carried by a handling arm between, for example, a load lock chamber (not shown) and the reaction chamber 10 coupled through the gate valve. A handling arm formed of, for example, synthetic quarts can be inserted into a space between the shower plate 100 and the wafer support unit 12.

Hereinafter, the shower plate 100 of this embodiment will be described in detail. FIG. 2 is a schematic top view of the shower plate 100 of this embodiment. FIG. 3 is an A-A cross-sectional view of FIG. 2, and FIGS. 4A, 4B, and 4C are respectively a B-B cross-sectional view, a C-C cross-sectional view, and a D-D cross-sectional view of FIG. 2.

The shower plate 100 has a plate shape having a predetermined thickness, for example. The shower plate 100 is formed of a metal material such as stainless steel and aluminum alloy.

The shower plate 100 includes a plurality of first lateral gas flow passages 101, a plurality of second lateral gas flow passages 102, and a plurality of third lateral gas flow passages 103. The plurality of first lateral gas flow passages 101 is arranged in a first horizontal plane (P1) and extends parallel to each other. The plurality of second lateral gas flow passages 102 is arranged in a second horizontal plane (P2) upper than the first horizontal plane and extends parallel to each other. The plurality of third lateral gas flow passages 103 is arranged in a third horizontal plane (P3) upper than the first horizontal plane and lower than the second horizontal plane and extends parallel to each other.

The shower plate 100 has a plurality of first longitudinal gas flow passages 121 connected to the first lateral gas flow passages 101, extending in the longitudinal direction, and having the first gas ejection hole 111 provided on the reaction chamber 10 side. The shower plate 100 further has a plurality of second longitudinal gas flow passages 122 connected to the second lateral gas flow passages 102, extending in the longitudinal direction, and having the second gas ejection hole 112 provided on the reaction chamber 10 side. The second longitudinal gas flow passage 122 passes through between the two first lateral gas flow passages 101. The shower plate 100 furthermore has a plurality of third longitudinal gas flow passages 123 connected to the third lateral gas flow passages 103, extending in the longitudinal direction, and having the third gas ejection hole 113 provided on the reaction chamber 10 side. The third longitudinal gas flow passage 123 passes through between the two first lateral gas flow passages 101.

The first lateral gas flow passage 101, the second lateral gas flow passage 102, and the third lateral gas flow passage 103 are lateral holes provided in the horizontal direction in the plate-shaped shower plate 100. The first longitudinal gas flow passage 121, the second longitudinal gas flow passage 122, and the third longitudinal gas flow passage 123 are longitudinal holes formed in the gravitational force direction (the longitudinal direction or the vertical direction) in the plate-shaped shower plate 100.

The respective inner diameters of the first, second, and third lateral gas flow passages 101, 102, and 103 are larger than the respective inner diameters of the corresponding first, second, and third longitudinal gas flow passages 121, 122, and 123. In FIGS. 3, 4A, 4B, and 4C, although the first, second, and third lateral gas flow passages 101, 102, and 103 and the first, second, and third longitudinal gas flow passages 121, 122, and 123 each have a circular cross-sectional shape, their shapes are not limited to the circular shape and may be an elliptical shape, a rectangular shape, a polygonal shape, or others.

The shower plate 100 includes a first manifold 131 connected to a first gas supply passage 31 and provided upper than the first horizontal plane (P1) and a first connection flow passage 141 connecting the first manifold 131 and the first lateral gas flow passage 101 at an end of the first lateral gas flow passage 101 and extending in the longitudinal direction.

The first manifold 131 has a function of distributing the first process gas, supplied from the first gas supply passage 31, to the plurality of first lateral gas flow passages 101 through the first connection flow passage 141. The distributed first process gas is introduced into the reaction chamber 10 through the first gas ejection hole 111 of the plurality of first longitudinal gas flow passages 121.

The first manifold 131 extends in a direction perpendicular to the first lateral gas flow passage 101 and has a hollow rectangular solid shape, for example. In this embodiment, although the first manifold 131 is provided at both ends of the first lateral gas flow passage 101, the first manifold 131 may be provided at any one of the ends.

The shower plate 100 has a second manifold 132 connected to the second gas supply passage 32 and provided upper than the first horizontal plane (P1) and a second connection flow passage 142 connecting the second manifold 132 and the second lateral gas flow passage 102 at an end of the second lateral gas flow passage 102 and extending in the longitudinal direction.

The second manifold 132 has a function of distributing the second process gas, supplied from the second gas supply passage 32, to the plurality of second lateral gas flow passages 102 through the second connection flow passage 142. The distributed second process gas is introduced into the reaction chamber 10 through the second gas ejection hole 112 of the plurality of second longitudinal gas flow passages 122.

The second manifold 132 extends in a direction perpendicular to the second lateral gas flow passage 102 and has a hollow rectangular solid shape, for example. In this embodiment, although the first manifold 132 is provided at both ends of the second lateral gas flow passage 102, the second manifold 132 may be provided at any one of the ends.

The shower plate 100 further has a third manifold 133 connected to the third gas supply passage 33 and provided upper than the first horizontal plane (P1) and a third connection flow passage 143 connecting the third manifold 133 and the third lateral gas flow passage 103 at an end of the third lateral gas flow passage 103 and extending in the vertical direction.

The third manifold 133 has a function of distributing the third process gas, supplied from the third gas supply passage 33, to the plurality of third lateral gas flow passages 103 through the third connection flow passage 143. The distributed third process gas is introduced into the reaction chamber 10 through the third gas ejection hole 113 of the plurality of third longitudinal gas flow passages 123.

In general, the flow rate of the process gas ejected into the reaction chamber 10 through the gas ejection hole provided, as a supply port of the process gas, in the shower plate is preferably uniform between the gas ejection holes in terms of securing uniformity of film formation. According to the shower plate 100 of this embodiment, the process gas is distributed to the plurality of lateral gas flow passages to be further distributed to the longitudinal gas flow passages, and, thus, to be ejected through the gas ejection hole. According to this constitution, it is possible to enhance uniformity of the flow rate of the process gas ejected through between the gas ejection holes with a simple structure.

The arrangement density of the arranged gas ejection holes is preferably large as much as possible in terms of forming a uniform film. As in this embodiment, in the constitution in which the lateral gas flow passages parallel to each other are provided, if the density of the gas ejection hole is to be increased, a tradeoff occurs between the arrangement density of the gas ejection holes and an inner diameter of the lateral gas flow passage.

Thus, as the inner diameter of the lateral gas flow passage decreases, the fluid resistance of the lateral gas flow passage increases, and the flow rate distribution of the flow rate of the process gas ejected through the gas ejection hole increases in the extending direction of the lateral gas flow passage, so that the uniformity of the flow rate of the process gas ejected through between the gas ejection holes may be deteriorated.

According to this embodiment, a hierarchical structure in which the first lateral gas flow passage 101, the second lateral gas flow passage 102, and the third lateral gas flow passage 103 are provided in different horizontal planes is provided. According to this structure, a margin with respect to the enlargement of the inner diameter of the lateral gas flow passage is enhanced. Accordingly, while the density of the gas ejection hole is increased, enlargement of the flow rate distribution due to the inner diameter of the lateral gas flow passage is suppressed. Thus, as a result, the flow rate distribution of the process gas ejected into the reaction chamber 10 is uniformized, and the uniformity of film formation can be enhanced.

Next, a vapor phase growth method of this embodiment will be described, taking as an example a case where GaN is epitaxially grown.

The vapor phase growth method of this embodiment is performed using the single wafer type epitaxial growth apparatus shown in FIG. 1.

First, the semiconductor wafer W is placed on the support unit 12 in the reaction chamber 10. For example, the gate valve (not shown) of the wafer outlet and inlet of the reaction chamber 10 is opened, and the semiconductor wafer W in the load lock chamber is carried into the reaction chamber 10 by the handling arm. The semiconductor wafer W is then placed on the support unit 12 through the push-up pin (not shown), for example. The handling arm is returned to the load lock chamber, and the gate valve is closed.

Then, the vacuum pump (not shown) is activated to exhaust the gas in the reaction chamber 10 through the gas exhaust unit 26 to set the degree of vacuum to a predetermined value. The semiconductor wafer W placed on the support unit 12 is preheated to a predetermined temperature by the heating unit 16. Pleating output of the heating unit 16 is increased to raise the temperature of the semiconductor wafer W to an epitaxial growth temperature.

Then, the exhaust through the vacuum pump is continued, and, at the same time, while the rotary body unit 14 is rotated at a required speed, the predetermined first to third process gasses are ejected through the first to third gas ejection holes 111, 112 and 113. The first process gas is supplied through the first gas supply passage 31 and ejected into the reaction chamber 10 through the first gas ejection hole 111 via the first manifold 131, the first connection flow passage 141, the first lateral gas flow passage 101, and the first longitudinal gas flow passage 121. The second process gas is supplied through the second gas supply passage 32 and ejected into the reaction chamber 10 through the second gas ejection hole 112 via the second manifold 132, the second connection flow passage 142, the second lateral gas flow passage 102, and the second longitudinal gas flow passage 122. The third process gas is supplied through the third gas supply passage 33 and ejected into the reaction chamber 10 through the third gas ejection hole 113 via the third manifold 133, the third connection flow passage 143, the third lateral gas flow passage 103, and the third longitudinal gas flow passage 123.

When GaN is grown on the semiconductor wafer W, for example, the first process gas is hydrogen as the separation gas, the second process gas is ammonia as the source gas of nitrogen, and the third process gas is TMG as the source gas of gallium diluted with hydrogen as the carrier gas.

The first to third process gasses ejected through the first to third gas ejection holes 111, 112 and 113 are suitably mixed to be supplied onto the semiconductor wafer W in a uniform rectified state, whereby a single crystal film of GaN (gallium nitride) is formed on the surface of the semiconductor wafer W by epitaxial growth.

When the epitaxial growth is finished, the ejecting of the first to third process gasses through the first to third gas ejection holes 111, 112 and 113 is stopped, the supply of the process gas onto the semiconductor wafer W is interrupted, and the growth of the single crystal film is finished.

After the film formation, dropping of the temperature of the semiconductor wafer W is started. For example, the rotation of the rotary body unit 14 is stopped, and while the semiconductor wafer W formed with the single crystal film remains placed on the support unit 12, the heating output of the heating unit 16 is initialized, and the temperature of the semiconductor wafer W is adjusted to be reduced to the temperature of preheating.

Next, after the temperature of the semiconductor wafer W is stabilized at a predetermined temperature, the semiconductor wafer W is dismounted from the support unit 12 by the push-up pin, for example. Then, the gate valve is opened again to insert the handling arm in between the shower plate 100 and the support unit 12, and, thus, to place the semiconductor wafer W on the handling arm. The handling arm on which the semiconductor wafer W is placed is returned to the load lock chamber.

The single film-formation onto the semiconductor wafer W is finished as described above, and, for example, the film formation onto another semiconductor wafer W may be successively performed in accordance with the same process sequence as described above.

In the vapor phase growth method of this embodiment, by virtue of the use of the epitaxial growth apparatus shown in FIG. 1, the flow of the process gas is uniformized and stabilized, and a film excellent in uniformity of film thickness, film quality, and so on can be formed on a substrate.

Second Embodiment

A vapor phase growth apparatus of this embodiment is different from the first embodiment in that an inner diameter of a second longitudinal gas flow passage of a shower plate is larger than an inner diameter of a first longitudinal gas flow passage, an interval between the second longitudinal gas flow passages adjacent to each other is smaller than an interval between the first longitudinal gas flow passages adjacent to each other, and an inner diameter of a second lateral gas flow passage is larger than an inner diameter of a first lateral gas flow passage. The vapor phase growth apparatus of this embodiment has a first gas supply passage through which a first process gas is supplied and a second gas supply passage through which a second process gas having a kinematic viscosity lower than that of the first process gas is supplied. The first gas supply passage is connected to the first lateral gas flow passage, and the second gas supply passage is connected to the second lateral gas flow passage. Hereinafter, the description of the contents overlapped with those of the first embodiment is omitted.

According to this embodiment, the flow velocity during ejecting of the process gas having a low kinematic viscosity is suppressed, whereby turbulence of the process gas having a high kinematic viscosity and ejected through gas ejection holes adjacent to each other can be suppressed. Thus, the straightening properties of the process gas flow are enhanced, so that the film formation with high uniformity in film thickness and film quality can be realized.

Figure 5:
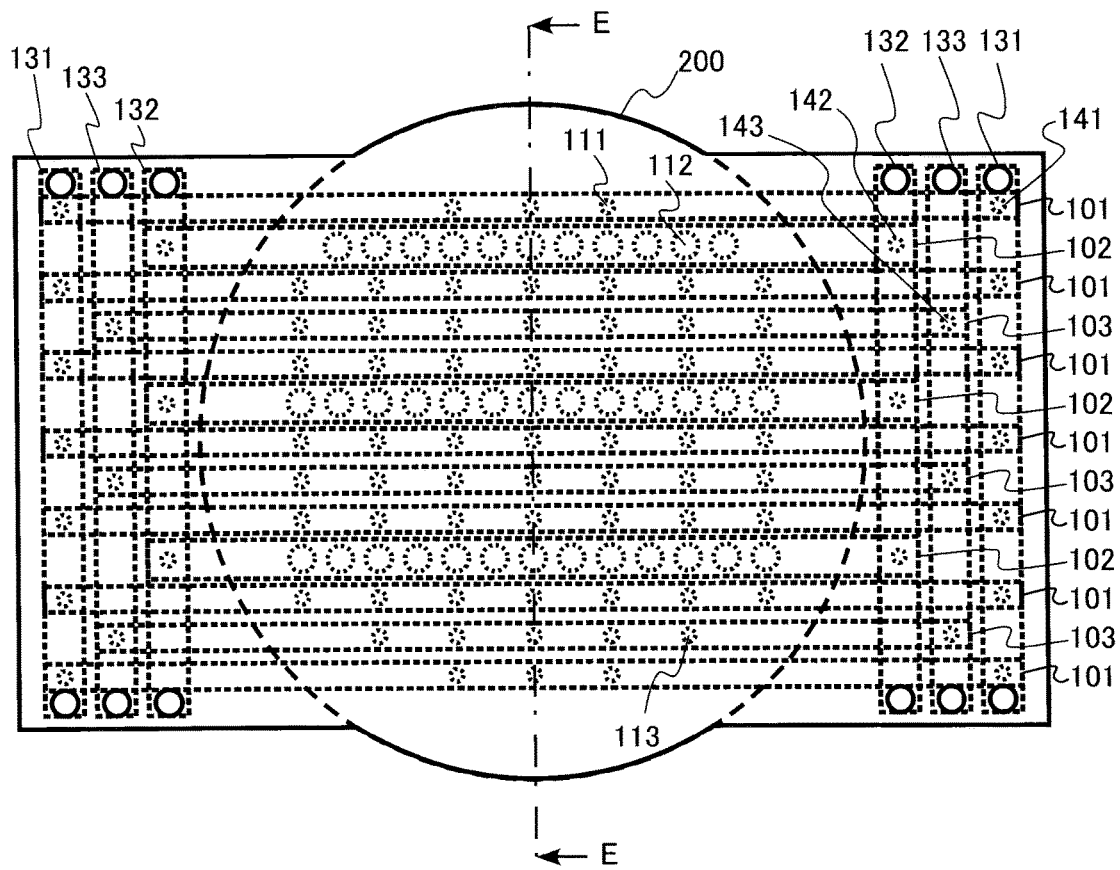
FIG. 5 is a schematic top view of a shower plate of a second embodiment.
Figure 6:
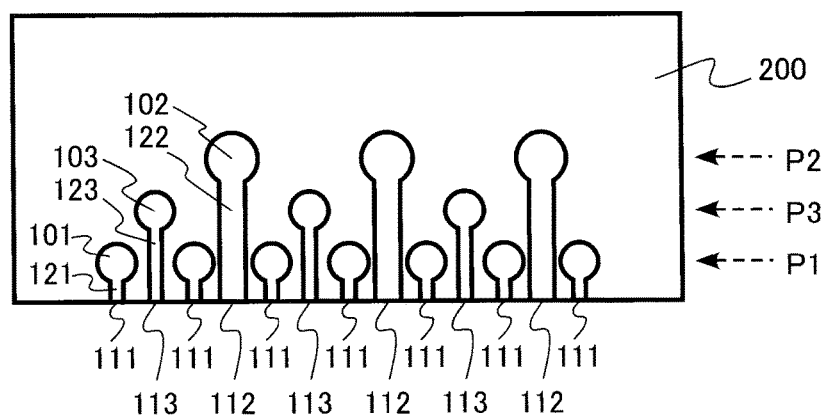
FIG. 6 is an E-E cross-sectional view of the shower plate of FIG. 5.

FIG. 5 is a schematic top view of a shower plate of this embodiment. FIG. 6 is an E-E cross-sectional view of FIG. 5.

As in the first embodiment, a shower plate 200 includes a plurality of first lateral gas flow passages 101, a plurality of second lateral gas flow passages 102, and a plurality of third lateral gas flow passages 103. The plurality of first lateral gas flow passages 101 is arranged in a first horizontal plane (P1) and extends parallel to each other. The plurality of second lateral gas flow passages 102 is arranged in a second horizontal plane (P2) upper than the first horizontal plane and extends parallel to each other. The plurality of third lateral gas flow passages 103 is arranged in a third horizontal plane (P3) upper than the first horizontal plane and lower than the second horizontal plane and extends parallel to each other.

The shower plate 200 has a plurality of first longitudinal gas flow passages 121 connected to the first lateral gas flow passages 101, extending in the longitudinal direction, and having a first gas ejection hole 111 provided on the reaction chamber 10 side. The shower plate 100 further has a plurality of second longitudinal gas flow passages 122 connected to the second lateral gas flow passages 102, extending in the longitudinal direction, and having a second gas ejection hole 112 provided on the reaction chamber 10 side. The second longitudinal gas flow passage 122 passes through between the first lateral gas flow passages 101. The shower plate 200 furthermore has a plurality of third longitudinal gas flow passages 123 connected to the third lateral gas flow passages 103, extending in the longitudinal direction, and having a third gas ejection hole 113 provided on the reaction chamber 10 side. The third longitudinal gas flow passage 123 passes through between the first lateral gas flow passages 101.

An inner diameter of the second longitudinal gas flow passages 122 is larger than an inner diameter of the first longitudinal gas flow passages 121. An inner diameter of the third lateral gas flow passage 123 is the same as the inner diameter of the first longitudinal gas flow passage 121, for example. The inner diameter of the first longitudinal gas flow passage 121 is equal to a diameter of the first gas ejection hole 111, the inner diameter of the second longitudinal gas flow passages 122 is equal to a diameter of the second gas ejection hole 112, and the inner diameter of the third longitudinal gas flow passage 123 is equal to a diameter of the third gas ejection hole 113.

An interval between the centers of the second longitudinal gas flow passages 122 adjacent to each other is smaller than an interval between the centers of the first longitudinal gas flow passages 121 adjacent to each other. In other words, the interval between the centers of the second gas ejection holes 112 is smaller than the interval between the centers of the first gas ejection holes 111. An interval between the centers of the third longitudinal gas flow passages 123 adjacent to each other is equal to the interval between the centers of the first longitudinal gas flow passages 121 adjacent to each other, for example. Namely, an interval between the centers of the third gas ejection holes 113 is equal to the interval between the centers of the first gas ejection holes.

The inner diameter of the second lateral gas flow passage 102 is larger than the inner diameter of the first lateral gas flow passage 101.

The epitaxial growth apparatus of this embodiment has a first gas supply passage 31 through which a first process gas is supplied, a second gas supply passage 32 through which a second process gas is supplied, and a third gas supply passage 33 through which a third process gas is supplied, as with the epitaxial growth apparatus of the first embodiment shown in FIG. 1.

The kinematic viscosity of the second process gas is lower than that of the first process gas. The kinematic viscosity of the third process gas is equivalent to the kinematic viscosity of the first process gas, for example. Namely, the kinematic viscosity of the third process gas is higher than the kinematic viscosity of the second process gas.

The kinematic viscosity (v) is a value obtained by dividing an absolute viscosity ($\mu$) of a fluid by a density ($\rho$) and is represented by $v=\mu/\rho$.

The kinematic viscosity is an index qualitatively representing the difficulty in movement of the fluid itself, and as the kinematic viscosity becomes small, the fluid more easily moves.

When a GaN single crystal film is formed on the semiconductor wafer W by the MOCVD method, for example, hydrogen ($H_2$) as a separation gas is supplied as the first process gas, ammonia ($NH_3$) as a source gas of nitrogen (N) is supplied as the second process gas, and a gas prepared by diluting trimethylgallium (TMG) as a Ga (gallium) source gas with hydrogen ($H_2$) as a carrier gas is supplied as the third process gas.

In the above case, ammonia ($NH_3$) as the second process gas has a kinematic viscosity lower than that of hydrogen ($H_2$) as the first process gas.

In the film formation of GaN, ammonia ($NH_3$) as the second process gas is ejected through the second gas ejection hole 112, and hydrogen ($H_2$) as the first process gas is ejected through the first gas ejection hole 111. At this time, when the ejecting speed of ammonia having a kinematic viscosity lower than that of hydrogen is faster than the ejecting speed of hydrogen having a larger kinematic viscosity, the dynamic pressure of ammonia becomes large, and a turbulent flow is generated due to attraction of hydrogen, so that the flow of the process gas may be deteriorated.

The following relation is established between a total pressure ($P_0$), a static pressure (P), a velocity (v) of a fluid, and density ($\rho$) of the fluid:

$P+0.5\rho v^2=P_0$.

Here, 0.5 $\rho v$ is a dynamic pressure. A so-called venturi effect occurs that the faster the velocity v of the fluid, the larger the dynamic pressure, and the static pressure (P) is reduced. For example, when the flow velocity of ammonia is faster than the flow velocity of hydrogen of the separation gas, the static pressure near the gas ejection hole through which ammonia is ejected is reduced, and hydrogen is attracted to facilitate occurrence of the turbulent flow.

In this embodiment, in the second longitudinal gas flow passage 122 through which the second process gas having a low kinematic viscosity and an easily increased flow velocity flows, the inner diameter of the second longitudinal gas flow passage 122 is increased, and, in addition, the interval is narrowed to increase the number. According to this constitution, the ejecting speed of the second process gas having a low kinematic viscosity, that is, ammonium in this embodiment is reduced. Accordingly, a difference from the ejecting speed of the first process gas having a high kinematic viscosity, that is, hydrogen in this embodiment becomes small, and the turbulent flow can be suppressed.

Particularly, the inner diameter of the second longitudinal gas flow passage 122 is increased, and, in addition, the interval is narrowed to increase the number, whereby the fluid resistance of the second longitudinal gas flow passage 122 is reduced. Thus, the gas flow rate distribution in the extending direction of the second lateral gas flow passage 102 becomes large, and the uniformity of film formation may be lowered.

In this embodiment, a constitution is adopted in which the second lateral gas flow passage 102 is provided upper than the first lateral gas flow passage 101, whereby the length of the second longitudinal gas flow passage 122 is made larger than the length of the first longitudinal gas flow passage 121, and the fluid resistance is relatively increased. The gas flow rate distribution in the extending direction of the second lateral gas flow passage 102 can be uniformized by increasing the fluid resistance of the second longitudinal gas flow passage 122.

In this embodiment, the inner diameter of the second lateral gas flow passage 102 is larger than the inner diameter of the first lateral gas flow passage 101. The inner diameter of the second lateral gas flow passage 102 is increased, whereby the fluid resistance of the second lateral gas flow passage 102 is reduced, so that the gas flow rate distribution in the extending direction of the second lateral gas flow passage 102 can be uniformized.

When the lateral gas flow passage has a hierarchical structure, the uppermost lateral gas flow passage can have the most increased margin of inner diameter enlargement, because the longitudinal gas flow passage in another hierarchy does not pass through the uppermost lateral gas flow passage. Thus, in the structure having three or more layers as in this embodiment, it is preferable in terms of uniformizing the gas flow rate distribution to provide the lateral gas flow passage through which a process gas having a low kinematic viscosity flows is provided at the uppermost portion.

In order to suppress the ejecting speed of the second process gas having a low kinematic viscosity, a constitution may be adopted which employs any one of the followings: the inner diameter of the second longitudinal gas flow passage 122 through which the second process gas having a low kinematic viscosity and an easily increased flow velocity flows is increased; and the interval is narrowed to increase the number.

According to the vapor phase growth apparatus of this embodiment, the occurrence of turbulent flow near the gas ejection hole is suppressed, whereby the flow of the process gas is uniformized and stabilized, and a film excellent in uniformity of film thickness, film quality, and so on can be formed on a substrate.

Next, a vapor phase growth method of this embodiment will be described. The vapor phase growth method of this embodiment is similar to the vapor phase growth method of the first embodiment, except that the inner diameter of the second longitudinal gas flow passage is larger than the inner diameter of the first longitudinal gas flow passage, the inner diameter of the second lateral gas flow passage is larger than the inner diameter of the first lateral gas flow passage, a process gas having a kinematic viscosity lower than that of a process gas in the first lateral gas flow passage is supplied to the second lateral gas flow passage, and a gas having a kinematic viscosity lower than a gas ejected through the first gas ejection hole is ejected through the second gas ejection hole.

The vapor phase growth method of this embodiment is performed using a single wafer type epitaxial growth apparatus including the shower plate 200 shown in FIG. 5.

A process gas having a kinematic viscosity lower than that of the process gas in the first lateral gas flow passage 101 is supplied to the second lateral gas flow passage 102, and a gas having a kinematic viscosity lower than the gas ejected through the first gas ejection hole is ejected through the second gas ejection hole 112.

When GaN is film-formed, hydrogen (first process gas) as a separation gas is ejected through the first gas ejection hole 111, ammonia (second process gas) as a source gas of nitrogen having a kinematic viscosity lower than that of hydrogen is ejected through the second gas ejection hole 112, and TMG (third process gas) as a source gas of gallium diluted with hydrogen as a carrier gas is ejected through the third gas ejection hole 113.

The process gases ejected through the first to third gas ejection holes 111, 112 and 113 are suitably mixed to be supplied onto the semiconductor wafer W in a rectified state. In particular, such a matter that the flows of hydrogen and ammonia having different kinematic viscosities are made to become turbulent flow by the venturi effect is suppressed. Consequently, a single crystal film of GaN (gallium nitride) is formed on the surface of the semiconductor wafer W by epitaxial growth to have good uniformity.

In the vapor phase growth method of this embodiment, the occurrence of the turbulent flow near the gas ejection hole is suppressed, whereby the flow of the process gas is uniformized and stabilized, and a film excellent in uniformity of film thickness, film quality, and so on can be formed on a substrate.

A vapor phase growth apparatus of a variation of this embodiment includes a reaction chamber, a shower plate disposed in an upper portion of the reaction chamber and configured to supply a gas into the reaction chamber, and a support unit provided below the shower plate in the reaction chamber and capable of placing a substrate thereon. The shower plate includes a plurality of first lateral gas flow passages arranged in a horizontal plane and extending parallel to each other and a plurality of first longitudinal gas flow passages connected to the first lateral gas flow passages, extending in the longitudinal direction, and having a first gas ejection hole provided on the reaction chamber side. The shower plate further includes a plurality of second lateral gas flow passages arranged in the horizontal plane and extending parallel to each other in the same direction as the first lateral gas flow passages and a plurality of second longitudinal flow passages connected to the second lateral gas flow passages, extending in the longitudinal direction, and having a second gas ejection hole provided on the reaction chamber side.

The shower plate furthermore includes a first gas supply passage through which a first process gas is supplied and a second gas supply passage through which a second process gas having a kinematic viscosity lower than that of the first process gas is supplied. The first gas supply passage is connected to the first lateral gas flow passage, and the second gas supply passage is connected to the second lateral gas flow passage. An inner diameter of the second longitudinal gas flow passage is larger than an inner diameter of the first longitudinal gas flow passage, or an interval between the second longitudinal gas low passages adjacent to each other is smaller than an interval of the first longitudinal gas flow passages adjacent to each other.

This variation is different from the above embodiment in that the first and second lateral gas flow passages are arranged on the same horizontal plane and do not have the hierarchical structure. Also in this variation, the occurrence of the turbulent flow near the gas ejection hole is suppressed, whereby the flow of the process gas is uniformized and stabilized, and a film excellent in uniformity of film thickness, film quality, and so on can be formed on a substrate.

It is preferable in terms of uniformizing the flow rate distribution that the inner diameter of the second lateral gas flow passage be larger than the inner diameter of the first lateral gas flow passage.

Further, it is preferable in terms of uniformizing the flow rate distribution that the inner diameter of the second longitudinal gas flow passage be larger than the inner diameter of the first longitudinal gas flow passage, and the interval between the second longitudinal gas flow passages adjacent to each other be smaller than the interval of the first longitudinal gas flow passages adjacent to each other.

Third Embodiment

A vapor phase growth apparatus of this embodiment has a first lateral gas flow passage (k) in which the number of first longitudinal gas flow passages connected thereto is k (k is an integer not less than 1) and a first lateral gas flow passage (n) in which the number of the first longitudinal gas flow passages connected thereto is n (k<n, n is an integer not less than 2), and the fluid resistance of a first connection flow passage connected to the first lateral gas flow passage (k) is larger than the fluid resistance of a first connection flow passage connected to the first lateral gas flow passage (n). Alternatively, the vapor phase growth apparatus of this embodiment has a second lateral gas flow passage (k) in which the number of second longitudinal gas flow passages connected thereto is k (k is an integer not less than 1) and second lateral gas flow passage (n) in which the number of the second longitudinal gas flow passages connected thereto is n (k<n, n is an integer not less than 2), and the fluid resistance of a second connection flow passage connected to the second lateral gas flow passage (k) is larger than the fluid resistance of a second connection flow passage connected to the second lateral gas flow passage (n). Except for the above point, this vapor phase growth apparatus is similar to that of the first embodiment. Accordingly, the description of the contents overlapped with those of the first embodiment is partially omitted.

According to this embodiment, occurrence of a difference in the flow rate of ejected gas between the plurality of first or second lateral gas flow passages is suppressed by adjusting the fluid resistance of the first or second connection flow passage through which the process gas is introduced into the first or second lateral gas flow passage. Thus, the flow rate distribution of the process gas is uniformized, and the film formation with high uniformity in film thickness, film quality, and so on can be realized.

FIG. 7 is a schematic top view of a shower plate of this embodiment. FIG. 8 is an F-F cross-sectional view of FIG. 7.

As in the first embodiment, a shower plate 300 includes a plurality of first lateral gas flow passages 101a, 101b, a plurality of second lateral gas flow passages 102, and a plurality of third lateral gas flow passages 103. The plurality of first lateral gas flow passages 101a, 101b is arranged in a first horizontal plane (P1) and extends parallel to each other. The plurality of second lateral gas flow passages 102 is arranged in a second horizontal plane (P2) upper than the first horizontal plane and extends parallel to each other. The plurality of third lateral gas flow passages 103 is arranged in a third horizontal plane (P3) upper than the first horizontal plane and lower than the second horizontal plane and extends parallel to each other.

The shower plate 300 has a plurality of first longitudinal gas flow passages 121 connected to the first lateral gas flow passages 101a, 101b, extending in the longitudinal direction, and having a first gas ejection hole 111 provided on the reaction chamber 10 side. The shower plate 300 further has a plurality of second longitudinal gas flow passages 122 connected to the second lateral gas flow passages 102, extending in the longitudinal direction, and having a second gas ejection hole 112 provided on the reaction chamber 10 side. The second longitudinal gas flow passage 122 passes through between the first lateral gas flow passages 101a, 101b. The shower plate 300 furthermore has a plurality of third longitudinal gas flow passages 123 connected to the third lateral gas flow passages 103, extending in the longitudinal direction, and having a third gas ejection hole 113 provided on the reaction chamber 10 side. The third longitudinal gas flow passage 123 passes through between the first lateral gas flow passages 101a, 101b.

The shower plate 300 has a first lateral gas flow passage (3) 101a in which the number of the first longitudinal gas flow passages connected thereto is three and a first lateral gas flow passage (7) 101b in which the number of the first longitudinal gas flow passages connected thereto is seven. The fluid resistance of a first connection flow passage 141b connected to the first lateral gas flow passage (3) 101a is larger than the fluid resistance of the first connection flow passage 141a connected to the first lateral gas flow passage (7) 101b. More specifically, an inner diameter of the first connection flow passage (3) 141a is made smaller than an inner diameter of the first connection flow passage (7) 141b, whereby the fluid resistance of the first connection flow passage (3) 141a is increased.

In the lateral gas flow passage in which the number of the longitudinal gas flow passages, that is, the gas ejection holes is small, the flow rate of the process gas ejected through the gas ejection hole may be increased in comparison with the lateral gas flow passage in which the number of the longitudinal gas flow passages, that is, the gas ejection holes is large. As in this embodiment, the fluid resistance of the connection flow passage is adjusted by the number of the longitudinal gas flow passages, whereby variation of the flow rate of the process gas depending on the number of the longitudinal gas flow passages can be suppressed. Accordingly, the flow rate of the ejected process gas can be uniformized.

In this embodiment, although the first longitudinal gas flow passage, the first lateral gas flow passage, and the first connection flow passage have been described, similar embodiments may be employed for the second longitudinal gas flow passage, the second lateral gas flow passage, and the second connection flow passage, or the third longitudinal gas flow passage, the third lateral gas flow passage, and the third connection flow passage.

In this embodiment, although the case where k=3 and n=7 has been described, other values may be employed as long as k is an integer not less than 1, k<n, and n is an integer not less than 2. Variation of the number of the longitudinal gas flow passages connected to the lateral gas flow passage is not limited to two patterns, and there may be three or more patterns.

In this embodiment, although the example in which the fluid resistance of the connection flow passage is adjusted by changing the inner diameter of the connection flow passage has been described, the fluid resistance may be adjusted by, for example, pluralizing the connection flow passage and changing the number of the connection flow passages or providing an orifice.

Figure 9:
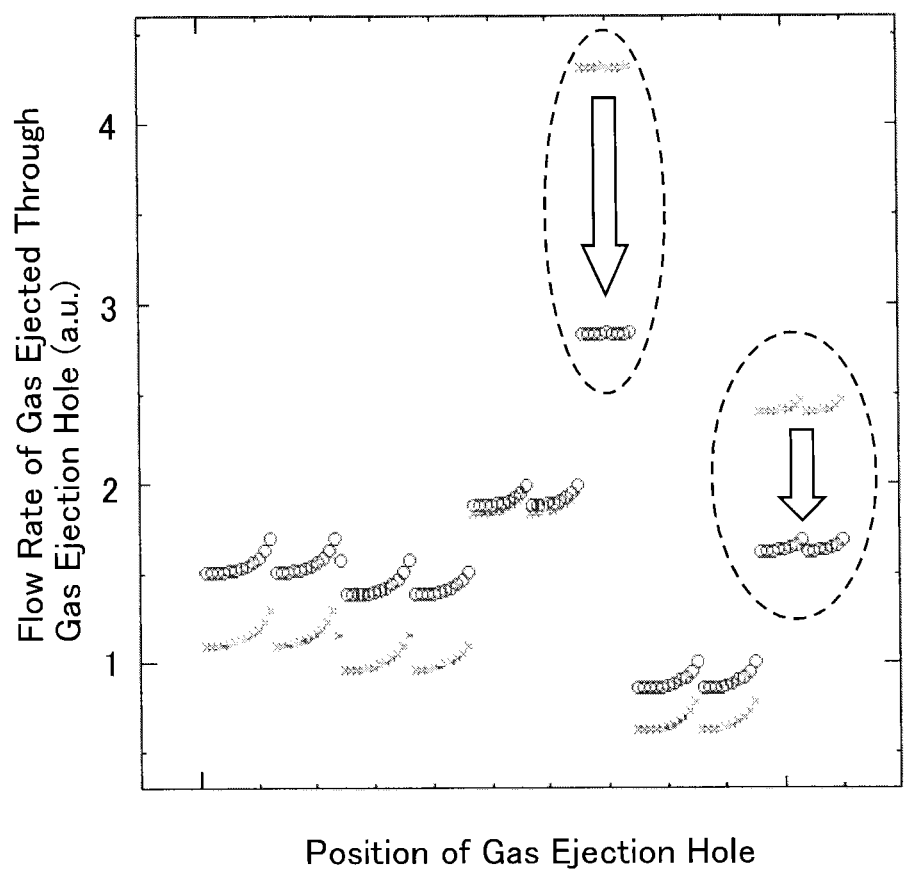
FIG. 9 is a view for explaining an effect of the shower plate of the third embodiment.

FIG. 9 shows simulation results showing an effect of adjusting the fluid resistance with the aid of an inner diameter of the connection flow passage. The horizontal axis represents the position of the gas ejection hole, and the vertical axis represents the flow rate of gas ejected through the gas ejection hole. In the position of the gas ejection hole, a two-dimensional position is represented as a one-dimensional position for the purpose of convenience.

In FIG. 9, x marks represent a case where the inner diameters of the connection flow passages are equal regardless of the number of the longitudinal gas flow passages connected to the single lateral gas flow passage. The marks surrounded by a dotted line represent data of the lateral gas flow passage in which the number of the longitudinal gas flow passages connected thereto is small. As seen in FIG. 9, it is found that the flow rate of ejected gas is large compared with other positions.

Meanwhile, circle marks represent a case where in the lateral gas flow passage in which the number of the longitudinal gas flow passages connected thereto is small, the inner diameter of the connection flow passage is reduced. In the lateral gas flow passage in which the number of the longitudinal gas flow passages is small, the flow rate of ejected gas is reduced, and in other lateral gas flow passages, the flow rate of ejected gas is increased. Consequently, the flow rate of ejected gas is uniformized between the lateral gas flow passages.

A vapor phase growth apparatus of a variation of this embodiment includes a reaction chamber, a shower plate disposed in an upper portion of the reaction chamber and configured to supply a gas into the reaction chamber, and a support unit provided below the shower plate in the reaction chamber and capable of placing a substrate thereon. The shower plate includes a plurality of lateral gas flow passages arranged in a first horizontal plane and extending parallel to each other and longitudinal gas flow passages connected to the lateral gas flow passages, extending in the longitudinal direction, and having a gas ejection hole provided on the reaction chamber side.

The vapor phase growth apparatus has a first lateral gas flow passage (k) in which the number of the longitudinal gas flow passages connected thereto is k (k is an integer not less than 1) and a first lateral gas flow passage (n) in which the number of the longitudinal gas flow passages connected thereto is n (k<n, n is an integer not less than 2), and the fluid resistance of a first connection flow passage connected to the first lateral gas flow passage (k) is larger than the fluid resistance of a first connection flow passage connected to the first lateral gas flow passage (n).

This variation is different from the above embodiment in that the first and second lateral gas flow passages provided on different horizontal planes and having the hierarchical structure are not always premised. Also in the variation, the fluid resistance of the connection flow passage is adjusted by the number of the longitudinal gas flow passages, whereby the variation of the flow rate of the process gas depending on the number of the longitudinal gas flow passages can be suppressed. Accordingly, the flow rate of the ejected process gas can be uniformized.

Hereinabove, the embodiments of the present disclosure have been described with reference to specific examples. The above embodiments are just examples, and the present disclosure is not limited thereto. The constituting elements of each embodiment may be appropriately combined.

For example, in the embodiments, although the example in which the three systems of flow passages such as the lateral gas flow passages are provided has been described, four or more systems of flow passages such as the lateral gas flow passages may be provided, or two systems of flow passages may be provided.

For example, in the embodiments, although the example in which the GaN (gallium nitride) single crystal film is formed has been described, the present disclosure is applicable to formation of an Si (silicon) single crystal film and an SiC (silicon carbide) single crystal film.

Although hydrogen ($H_2$) is used as an example of the process gas having a relatively high kinematic viscosity, helium (He) may also be used as the process gas having a high kinematic viscosity, for example. Meanwhile, although ammonia ($NH_3$) is used as an example of the process gas having a relatively low kinematic viscosity, other gases such as nitrogen ($N_2$) and argon (Ar) may also be used as the process gas having a low kinematic viscosity.

In the embodiments, although the single wafer type epitaxial growth apparatus forming a film on each wafer has been described as an example, the vapor phase growth apparatus is not limited to the single wafer type epitaxial growth apparatus. The present disclosure is applicable to, for example, a planetary CVD apparatus simultaneously forming films on a plurality of rotating and revolving wafers.

In the embodiments, although descriptions of portions not directly required for description of the present disclosure, such as a device configuration and a manufacturing method are omitted, required device configuration, manufacturing method, and so on can be suitably selected and used. All other vapor phase growth apparatuses and vapor phase growth methods which include the elements of this invention and can be appropriately changed in design by those skilled in the art are included in the scope of the present disclosure. The scope of the present disclosure is defined by the appended claims and the range of their equivalents.

What is claimed is:

1. A vapor phase growth apparatus comprising:
   a reaction chamber;
   a first gas supply passage through which a first process gas is supplied;
   a second gas supply passage through which a second process gas different from the first process gas is supplied;
   a shower plate disposed in an upper portion of the reaction chamber and configured to supply gas into the reaction chamber, the shower plate having
      first lateral gas flow passages arranged in a first horizontal plane and extending parallel to each other,
      a pair of first manifolds connected to the first gas supply passage, the pair of first manifolds provided above the first horizontal plane,
      first connection flow passages connecting the pair of first manifolds and the first lateral gas flow passages at both ends of the first lateral gas flow passages and extending in a longitudinal direction,
      first longitudinal gas flow passages being connected to the first lateral gas flow passages, the first longitudinal gas flow passages extending in the longitudinal direction, each of the first longitudinal gas flow passages having a first gas ejection hole provided on the reaction chamber side, second lateral gas flow passages arranged in a second horizontal plane above the first horizontal plane and extending parallel to each other in the same direction as the first lateral gas flow passages, a pair of second manifolds connected to the second gas supply passage, the pair of second manifolds provided above the second horizontal plane, second connection flow passages connecting the pair of second manifolds and the second lateral gas flow passages at both ends of the second lateral gas flow passages and extending in the longitudinal direction, second longitudinal gas flow passages being connected to the second lateral gas flow passages, the second longitudinal gas flow passages extending in the longitudinal direction through between the first lateral gas flow passages, each of the second longitudinal gas flow passages having a second gas ejection hole provided on the reaction chamber side; and a support unit provided below the shower plate in the reaction chamber, the support unit being capable of placing a substrate thereon.

2. The vapor phase growth apparatus according to claim 1,
wherein the second process gas has a kinematic viscosity lower than that of the first process gas.

3. The vapor phase growth apparatus according to claim 1, wherein an inner diameter of the second longitudinal gas flow passages is larger than an inner diameter of the first longitudinal gas flow passages.

4. The vapor phase growth apparatus according to claim 1, wherein an interval between the second longitudinal gas flow passages adjacent to each other is smaller than an interval between the first longitudinal gas flow passages adjacent to each other.

5. The vapor phase growth apparatus according to claim 1, wherein an inner diameter of the second lateral gas flow passages is larger than an inner diameter of the first lateral gas flow passages.

6. The vapor phase growth apparatus according to claim 1, where in the first lateral gas flow passages include a first lateral gas flow passage (k) and a first lateral gas flow passage (n), a number of the first longitudinal gas flow passages connected to the first lateral gas flow passage (k) being k (k is an integer not less than 1), a number of the first longitudinal gas flow passages connected to the first lateral gas flow passage (n) being n (k<n, n is an integer not less than 2), fluid resistance of the first connection flow passage connected to the first lateral gas flow passage (k) being larger than fluid resistance of one of the first connection flow passages connected to the first lateral gas flow passage (n), or, the second lateral gas flow passages include a second lateral gas flow passage (k) and a second lateral gas flow passage (n), a number of second longitudinal gas flow passages connected to the second lateral gas flow passage (k) being k (k is an integer not less than 1), a number of the second longitudinal gas flow passages connected to the second lateral gas flow passage (n) being n (k<n, n is an integer not less than 2), fluid resistance of the second connection flow passage connected to the second lateral gas flow passage (k) being larger than fluid resistance of one of the second connection flow passages connected to the second lateral gas flow passage (n).

7. The vapor phase growth apparatus according to claim 6, wherein an inner diameter of the first connection flow passage connected to the first lateral gas flow passage (k) is smaller than an inner diameter of the first connection flow passage connected to the first lateral gas flow passage (n), or an inner diameter of the second connection flow passage connected to the second lateral gas flow passage (k) is smaller than an inner diameter of the second connection flow passage connected to the second lateral gas flow passage (n).

8. The vapor phase growth apparatus according to claim 1, wherein the first process gas is hydrogen, and the second process gas is ammonia.

9. The vapor phase growth apparatus according to claim 1, wherein the shower plate further includes third lateral gas flow passages arranged in a third horizontal plane above the first horizontal plane and below the second horizontal plane and extending parallel to each other in the same direction as the first lateral gas flow passages, and third longitudinal gas flow passages connected to the third lateral gas flow passages, the third longitudinal gas flow passages extending in the longitudinal direction through between the first lateral gas flow passages, each of the third longitudinal gas flow passages having a third gas ejection hole provided on the reaction chamber side.

10. The vapor phase growth apparatus according to claim 9, further comprising:

a third gas supply passage through which a third process gas different from the first process gas and the second process gas is supplied, wherein the third gas supply passage is connected to the third lateral gas flow passages.

11. The vapor phase growth apparatus according to claim 10, wherein the first process gas is hydrogen, the second process gas is ammonia, and the third process gas is a gas containing organic metal.

* * * * *